United States Patent
Branco et al.

(10) Patent No.: US 6,841,008 B1
(45) Date of Patent: Jan. 11, 2005

(54) METHOD FOR CLEANING PLASMA ETCH CHAMBER STRUCTURES

(75) Inventors: Walter G. Branco, San Jose, CA (US); Jianmiu Qiao, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/617,454

(22) Filed: Jul. 17, 2000

(51) Int. Cl.$^7$ ............................................. B08B 7/04
(52) U.S. Cl. ............................. 134/26; 134/1.1; 134/30; 438/905
(58) Field of Search ........................... 134/1, 1.1, 6, 26, 134/30; 438/905; 216/63, 67, 83

(56) References Cited

U.S. PATENT DOCUMENTS

| | | | | |
|---|---|---|---|---|
| 4,334,950 A | * | 6/1982 | Roman ........................ | 156/643 |
| 4,370,195 A | * | 1/1983 | Halon et al. ................ | 156/643 |
| 4,778,532 A | * | 10/1988 | McConnell et al. .......... | 134/10 |
| 4,877,482 A | * | 10/1989 | Knapp et al. ............... | 156/643 |
| 4,975,146 A | * | 12/1990 | Knapp et al. ............... | 156/643 |
| 5,143,103 A | * | 9/1992 | Basso et al. ............... | 134/98.1 |
| 5,201,960 A | * | 4/1993 | Starov ........................ | 134/11 |
| 5,391,275 A | * | 2/1995 | Mintz ............................ | 134/1 |
| 5,567,333 A | * | 10/1996 | Hira et al. ................. | 216/22 |
| 5,646,095 A | * | 7/1997 | Eidelloth et al. ........... | 505/330 |
| 5,660,640 A | * | 8/1997 | Laube ........................... | 134/1 |
| 5,756,400 A | * | 5/1998 | Ye et al. ..................... | 438/710 |
| 5,855,974 A | * | 1/1999 | Wu et al. ..................... | 134/2 |
| 5,861,226 A | * | 1/1999 | Horne et al. ................. | 430/5 |
| 5,958,143 A | * | 9/1999 | Weber et al. ................. | 134/1 |
| 6,003,526 A | * | 12/1999 | Lo et al. ..................... | 134/1.1 |
| 6,014,979 A | * | 1/2000 | Van Autryve et al. ........ | 134/1.1 |
| 6,037,005 A | * | 3/2000 | Moshrefzadeh et al. .... | 427/286 |
| 6,074,569 A | * | 6/2000 | Kiziloglu et al. ............ | 216/62 |
| 6,204,189 B1 | * | 3/2001 | Petersen et al. ............ | 438/706 |
| 6,348,101 B1 | * | 2/2002 | Walter ........................... | 134/1 |
| 6,352,081 B1 | * | 3/2002 | Lu et al. ..................... | 134/22.1 |

* cited by examiner

*Primary Examiner*—Alexander Markoff
(74) *Attorney, Agent, or Firm*—Bradley T. Sako

(57) ABSTRACT

A method for cleaning a plasma reactor clamber part (100) may include dipping the chamber part in a solvent (102) that may dissolve a material that has been redistributed on the chamber part by a reactive plasma. A chamber part may then be rinsed (104), ultrasonically cleaned (106) in a ultrasonic cleaning liquid, and then rinsed again with a liquid that may evaporate at a lower temperature than an ultrasonic cleaning liquid (108). A chamber part may then be blown dry (110) and baked (112). In addition, or alternatively, a method may also include plasma cleaning a chamber part (202).

12 Claims, 3 Drawing Sheets

METHOD FOR CLEANING PLASMA ETCH CHAMBER STRUCTURES

TECHNICAL FIELD

The present invention relates generally to reactive plasma systems, and more particularly to the cleaning of plasma etch reactor parts.

BACKGROUND OF THE INVENTION

Most integrated circuit (IC) manufacturing processes typically include a number of manufacturing steps that can sequentially form, shape or otherwise modify various layers. One way of forming a layer can be to deposit and then etch the layer. Usually, etching can include forming an etch mask over an underlying layer. An etch mask may have a particular pattern that can mask certain portions of an underlying layer while exposing other portions. Etching can then remove portions of an underlying layer exposed by an etch mask. In this way, an etch mask pattern may be transfect to an underlying layer.

Etching may include "wet" chemical etching and "dry" plasma etching. In many cases, plasma etching can provide greater controllability and greater directional control (e.g., anisotropy) if desired.

An important issue in conventional plasma etching processes can be the redistribution of etched material. This issue will be explained with reference to FIG. 4. FIG. 4 is a side cross sectional view of various chamber parts 400 in a plasma reactor chamber that may hold a wafer 402.

In an etch process, active species of a plasma can etch materials on a wafer 402 surface and redistributed such materials onto chamber parts 400. If redistributed material is allowed to accumulate, such accumulated material can detach from chamber parts 400 and then land on a wafer, possibly forming a defect. Consequently, periodic maintenance of plasma etching equipment often includes cleaning chamber parts 400 to remove material redistributed by a reactive plasma.

As noted above, conventional etching in an integrated circuit manufacturing process can include an etch mask. Etch masks are often formed from photoresist. Photoresist typically includes a polymer-based material with an activating agent. When exposed to particular electromagnetic wavelengths (e.g, visible light X-rays, etc.) an activating agent may form crosslinks between polymers. A solvent can then be applied to a photoresist. Those portions of photoresist having crosslikes are less soluble than those portions of photoresist not having crosslinks. Thus, portions of photoresist exposed by a photomask can be remove. In this way, photolithographic techniques may then be used to "develop" and then form a pattern in photoresist with a photomask, or the like.

The transfer of a photoresist pattern to an underlying layer by etching typically relies on a high degree of selectivity between an etch mask layer and an underlying layer. However, while a plasma etch may have a such high degree of selectivity, active species within a plasma may still etch portions of an etch mask and redistribute etch mask material onto chamber parts.

Thus, periodic maintenance procedures are typically performed on etch systems to remove photoresist polymers that have been redistributed on etch chamber equipment.

A conventional plasma chamber part cleaning process will now be described with reference to FIG. 5. A conventional chamber part cleaning process 500 may include an initial wet chemical cleaning (step 502). For example, chamber equipment may be submerged in a mixture of hydrogen peroxide ($H_2O_2$) and ammonium hydroxide ($NH_{24}OH$). More particularly, chamber equipment may be submerged in a 30% solution of $H_2O_2$ in a 1:1 ratio with $NH_4OH$ for about 20 minutes.

Following a step 502, chamber parts may be rinsed in de-ionized (DI) water (step 504). Pressurized nitrogen gas (N2) under may then be used to blow dry chamber parts after being rinsed (step 506).

A method 500 may continue with an oven bake (step 508). An oven bake may particularly include loading blown dry chamber parts into an oven and baking the chamber parts for 30 minutes at about 110° C.

A drawback to a conventional method 500 can be how such a cleaning method affects chamber part surfaces. For example, chamber parts can typically be formed from quartz. A wet clean of $H_2O_2$ and $NH_4OH$ may each quartz surfaces changing surface textures. Changes in chamber part surfaces may result in drift in an etch process, as a changing surface conditions may alter gas flows and or etch chemistry. Further, because cleaning may consume etch chamber parts, such parts may have to be periodically replaced.

A conventional method 500 may include other drawbacks. First it has been observed that such a cleaning process may result in particles remaining on chamber parts. Thus, there may be an initial increase in particle defects following periodic maintenance of a plasma etching system. In addition, following a conventional cleaning process such as that shown in FIG. 5, redistributed polymer material may not adhere as well to etch chamber part surfaces. Consequently, such etch chamber parts may have to be cleaned with a certain minimum frequency to prevent redistributed material from accumulating to a point where it can contaminate wafers.

It would be desirable to arrive at some way of cleaning reactive plasma chamber parts that may address the various drawbacks of conventional cleaning processes.

SUMMARY OF THE INVENTION

A reactive plasma chamber may include chamber parts on which a material may be redistributed by a reactive plasma. The present invention may include methods of cleaning such a redistributed material from a chamber part.

According to one aspect of the invention, a method of cleaning a chamber part may include dipping a chamber part in a solvent for the redistributed material. A chamber part may then be rinsed of a solvent.

According to another aspect of the invention, a redistributed material may include photoresist polymers and a solvent may include acetone. Acetone may be rinsed with de-ionized water.

According to another aspect of the invention, a method of cleaning a chamber part may include plasma cleaning a chamber part with a reactive plasma having a high degree of selectivity between a redistributed material and a chamber part material.

According to another aspect of the invention, a redistributed material may include photoresist polymers and a reactive plasma may include oxygen as a source gas.

According to another aspect of the invention, a chamber part may be ultrasonically cleaned in an ultrasonic cleaning liquid. After an ultrasonic cleaning, a chamber part may be rinsed with a liquid having a lower evaporating temperature than an ultrasonic cleaning liquid.

According to another aspect of the invention, a chamber part may be blown dry and then baked.

DETAILED DESCRIPTION OF THE EMBODIMENTS

Various embodiments will now be described in conjunction with a number of diagrams. The embodiments set forth a method of cleaning plasma reactor equipment. In particular, methods for cleanings material from plasma reactor chamber parts that may have been redistributed from a wafer onto the chamber parts in a plasma etch process.

Figure 1:
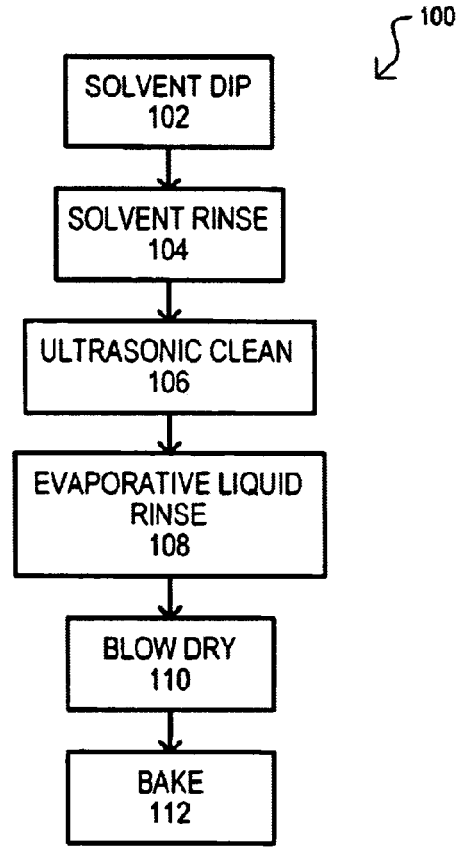
FIG. 1 is a flow diagram of a first embodiment of the present invention.

Referring now to FIG. 1, a flow diagram is set forth that shows a method of cleaning plasma reactor equipment according to a first embodiment. A first embodiment is designated by the general reference character 100 and may include a solvent dip (step 102). A solvent dip 102 may include immersing one or more pieces of plasma reactor equipment into a solvent. A solvent may be a solvent that can dissolve a material that has been redistributed onto a chamber part. For example, the solvent may be an organic solvent, such as acetone, methanol, ethanol, propanol, isoproponal, butanol, sec-butonal, methyl ethyl ketone (MFK), tetrahydrofuran, diethyl ether, tmethyl t-butyl ether, dimethyl sulfoxide, or N-methyl pyrolidone, to name but a few examples.

A first embodiment 100 may further include a solvent rinse (step 104). A solvent rinse 104 may include immersing and/or spraying a piece of chamber part to substantially remove solvent that may remain after a step 102.

After a solvent has been rinsed, a rinsed piece of equipment may be ultrasonically cleaned (step 106). An ultrasonic clean 106 may include submersing a piece of plasma reactor equipment in an ultrasonic cleaning liquid that can be subjected to vibrations at an ultrasonic frequency.

A first embodiment 100 may also include an evaporative liquid rinse (step 108). An evaporative liquid rinse 108 may include immersing and/or spraying a chamber part with a liquid that may evaporate at a lower temperature than an ultrasonic cleaning liquid.

After an evaporative liquid rinse 108, a chamber part can be blown dry (step 110). A step 110 may include spraying a chamber part with an inert gas that is under pressure. Such a drying step can accelerate the evaporation of a rinse liquid from step 108.

As shown in FIG. 1, a chamber part may then be baked (step 112). Baking 112 may include placing a chamber piece part into an oven at a temperature greater than room temperature for a predetermined period of time.

In this way, a chamber part having redistributed material thereon may be cleaned with a method that includes a dip (step 102) in a liquid that can be a solvent for the redistributed material. Such a dip may remove redistributed material from chamber parts without etching such chamber parts.

Figure 2:
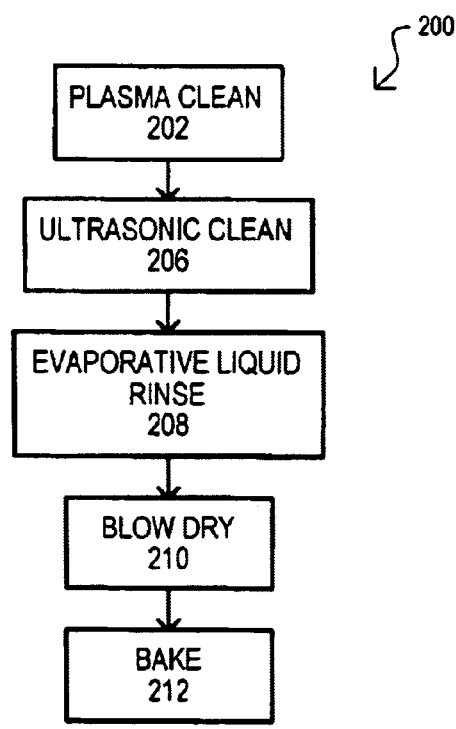
FIG. 2 is a flow diagram of a second embodiment of the present invention.

Referring now to FIG. 2, a second embodiment is disclosed in a flow diagram. A second embodiment is designated by the general reference character 200 and may include a plasma clean (step 202). A step 202 may include plasma cleaning chamber parts with a recipe that is highly selective between plasma a chamber part and a material that has been redistributed on such a chamber part. Such a selectivity can be greater than 1:100.

A second embodiment 200 may continue with steps like those described in conjunction with the first embodiment. To that extent, like references will be referred to by the same reference character but with the first digit being a "2" instead of a 1. To avoid undo repetition, a description of such steps will not be repeated.

A third embodiment will now be described with reference to FIG. 3. A third embodiment may include a method of cleaning redistributed etch mask material from plasma reactor chamber parts. More particularly, a third embodiment shows method of cleaning polymer-based photoresist from quartz chamber parts used in reactive plasma etching.

A third embodiment is designated by the general reference character 300 and may include an acetone dip (step 302). Acetone dip 302 can be a photoresist polymer solvent and may dissolve redistributed photoresist polymers formed on chamber parts. A step 302 may include filling a receptacle with acetone. Quartz chamber parts may then be submerged in acetone for a period of time that may be greater than 2 hours, less than 48 hours, even more particularly from about 6–24 hours.

In this way a solvent dip may be used to remove redistributed material from plasma reactor chamber parts.

A third embodiment 300 may further include a de-ionized (DI) water rinse (step 304). A step 304 may include placing quartz chamber parts that have been dipped in acetone under running DI water and/or a DI water bath. In one particular arrangement, quartz chamber parts may be placed under running DI water for about 10 to 60 minutes, more particularly about 15 to 30 minutes, even more particularly about 20 minutes.

A third embodiment 300 may also include an oxygen plasma clean (step 304). An oxygen plasma clean may include the steps of placing quartz chamber parts into a reactive plasma chamber. Quartz chamber parts may then be subjected or exposed to plasma that includes a source of oxygen such as $O_2$ gas, ozone, NO, $N_2O$, $NO_2$ or $SO_2$, but preferably comprises $O_2$, optionally in the presence of an inert gas such as He, Ne, Ar and/or $N_2$. In an oxygen plasma clean, a plasma chamber may be at a pressure in the general range of 200 mTorr to 2 Torr, more particularly about 1 Torr. Reactor chamber power may be in the general range of 500–1200 Watts, more particularly about 600–1000 Watts, even more particularly about 800 Watts. Such an oxygen plasma cleaning may last from 30–60 minutes, more particularly about 45 minutes.

In one particular arrangement, oxygen plasma cleaning may include an initial oxygen plasma clean that lasts for 45 minutes, Quartz chamber parts may then be removed and inspected. If residual photoresist remains, the quartz chamber parts may be oxygen plasma cleaned and inspected once again until they appear sufficiently clean. Such subsequent oxygen plasma cleans can be for 15 minutes, as but one example.

Plasma cleaning with oxygen as a source gas (also referred to "ashing") can remove organic based materials, such a polymer-based photoresist. At the same time, an oxygen plasma etch can leave quartz surfaces essentially unaltered. In this way, unlike conventional cleaning methods that may consume quartz material in an $H_2O_2$ and $NH_4OH$ dip, a third embodiment 300 may clean quartz material with a solvent and/or plasma clean that consumes essentially no quartz material.

A third embodiment 300 may continue with a DI water ultrasonic clean (step 308). A step 308 may include submersing quartz chamber equipment in DI water that may be subject to vibrations at an ultrasonic frequency. In one particular approach, two quartz chamber parts may be placed in an ultrasonic machine for a cycle lasting between 15 and 60 minutes, more particularly about 30 minutes.

A third embodiment 300 may also include a volatile solvent rinse (step 310), for example using isopropyl alcohol (IPA) or an organic solvent from the above list having a boiling point below 100° C., preferably below 90° C. A step 310 may include rinsing quartz chamber parts with a squirt bottle containing IPA.

After an IPA rinse 310, a chamber part can be blown dry with nitrogen gas $N_2$. $N_2$ gas may be an inert gas that is essentially non-reactive to quartz chamber part and/or the atmosphere. An $N_2$ blow dry step 312 can accelerate the evaporation of IPA.

Figure 3:
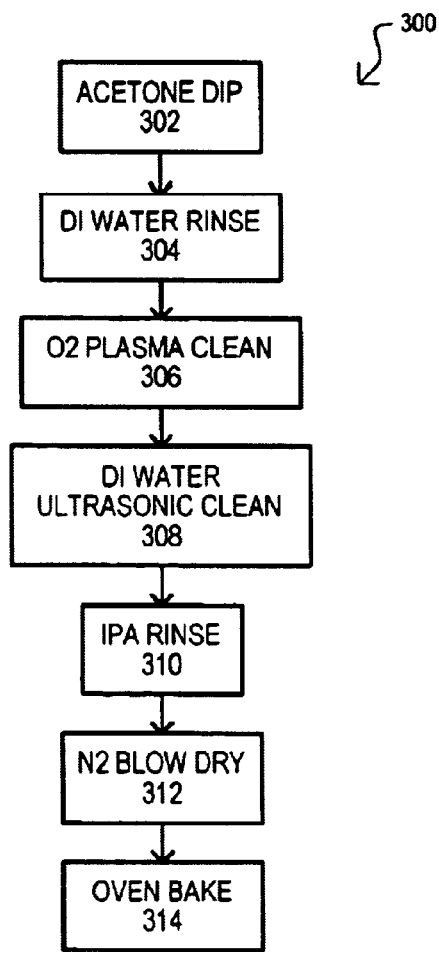
FIG. 3 is a flow diagram of a third embodiment of the present invention.
Figure 4:
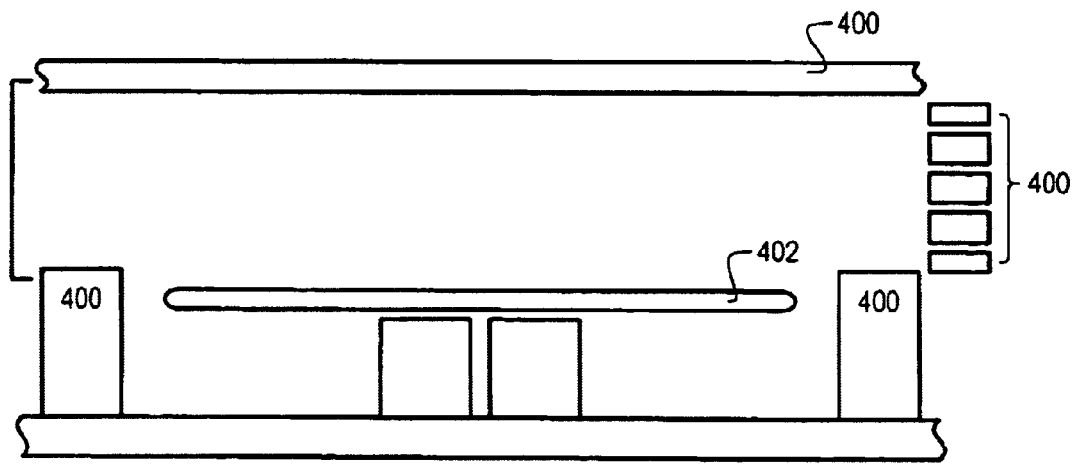
FIG. 4 is a side cross sectional view showing one example of a reactive plasma chamber.

As shown in FIG. 3, quartz chamber parts may then be baked (step 314). A step 314 may include placing quartz chamber parts in a top shelf of an oven. Such an oven may be at a temperature in the general range of 75–150° C., in particular about 80–120° C., more particularly about 110° C. Further, such a baking may have a duration of about 15–60 minutes, more particularly about 30 minutes.

Figure 5:
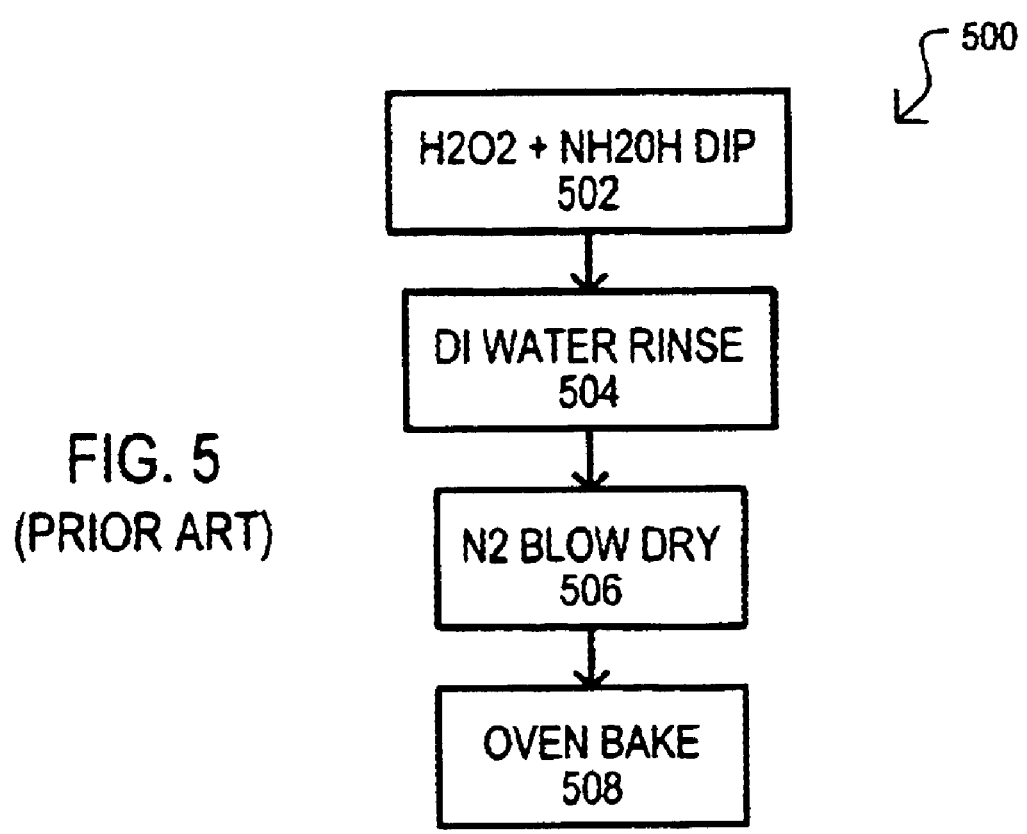
FIG. 5 is flow diagram showing a conventional etch chamber part cleaning method.

The present invention can provide an improved cleaning process for removing redistributed photoresist from plasma reactor chamber parts. It has been found that a method according to the present invention may increase maintenance cycle times from about less than 80 RF hours in the conventional case of FIG. 5, to more than 120 RF hours. RF hours include the times at which RF power is applied to a plasma etch machine. Such increases in maintenance cycle times can reduce maintenance costs and/or add to the throughput of a manufacturing process, as machines can be available for longer periods of time.

In addition, or alternatively, the present invention can reduce wear on chamber parts for a plasma reactor system. This can decrease cost of ownership for such a plasma reactor system, as parts may have to be replaced less frequently than in the case of conventional cleaning methods.

A cleaning method according to the present invention may advantageously clean parts having small openings. In particular, the present invention may be used to clean a gas distribution plate in a plasma reactor system. A gas distribution plate may include holes that can be difficult to clean. Other particular types of chamber parts that may be cleaned can include a viewport window and/or a shadow ring, which can surround a wafer in a reactor chamber.

It is understood that particular examples disclosed he should not be construed as limiting to the invention. For example, a particularly advantageous application of an acetone dip for photoresist polymer residue removal has been disclosed as one particular solvent/material combination, other solvent/material combinations may be possible. Along these same lines, while a particularly advantageous application of an oxygen plasma clean for photoresist polymer residue removal has been disclosed as one particular plasma/material combination, the teachings herein may be applied to arrive at other plasma/material combinations.

Thus, while the various particular embodiments have been set forth herein, methods according to the present invention could be subject to various changes, substitutions, and alterations without departing from the spirit and scope of the invention. Accordingly, the present invention is intended to be limited only as defined by the appended claims.

What is claimed is:

1. A method, comprising:
cleaning a plasma reactor chamber part of a maternal redistributed thereon by a reactive plasma process, by placing the chamber part in a redistributed material solvent for at least 6 hours;
cleaning the chamber part with a plasma that includes oxygen as a source gas; and
ultrasonically cleaning the chamber part; wherein
the material includes photoresist polymers and the solvent includes acetone.

2. The method of claim 1, wherein:
the chamber part comprises quartz.

3. The method of claim 1, wherein:
the plasma if formed with a radio frequency (RF) power in the general range of 500 to 1000 W.

4. The method of claim 1, further including:
rinsing the chamber part after cleaning with the solvent but before the plasma cleaning.

5. The method of claim 1, further including:
baking the chamber part at a temperature in the general range of 75–150° C.

6. A method of cleaning a plasma reactor chamber part, comprising:
plasma cleaning a chamber part of a material redistributed on the chamber part by a reactive plasma process, with a plasma having an etch selectivity between the chamber part and the redistributed material that is greater than 1:100;
cleaning the chamber part with an organic solvent of the redistributed material by placing the chamber part in the organic solvent of the redistributed material prior to the plasma cleaning.

7. The method of claim 6, wherein:
the chamber part comprises quartz and the plasma includes oxygen as a source gas.

8. The method of claim 6, wherein:
the plasma is formed with a radio frequency (RF) power in the general range of 500 to 1000 W.

9. The method of claim 6, wherein:
the redistributed material includes photoresist polymers.

10. A method of cleaning reactive plasma chamber parts, comprising the steps of:
applying an organic solvent to a surface of a chamber part;
oxygen plasma cleaning the chamber part;
ultrasonically cleaning the chamber part after the oxygen plasma cleaning; and
rinsing the chamber part with a liquid that evaporates at a lower temperature than water after the ultrasonic cleaning.

11. The method of claim 10, wherein:
the organic solvent includes acetone.

12. The method of claim 10, further including:
baking the chamber part at a temperature greater than 80° C. for at least 15 minutes.

* * * * *